United States Patent [19]

Kuwagata et al.

[11] 3,961,354
[45] June 1, 1976

[54] MESA TYPE THYRISTOR AND ITS MAKING METHOD

[75] Inventors: Masahiro Kuwagata, Suita; Masao Yamada, Takatsuki; Kenichiro Nakamura, Nagaokakyo; Yorisada Kawakami, Osaka, all of Japan

[73] Assignee: Matsushita Electronics Corporation, Osaka, Japan

[22] Filed: Nov. 19, 1973

[21] Appl. No.: 416,799

[30] Foreign Application Priority Data
Nov. 17, 1972   Japan............................ 47-115836

[52] U.S. Cl..................................... 357/39; 357/38; 357/52; 357/56; 148/186
[51] Int. Cl.²................. H01L 29/747; H01L 7/44
[58] Field of Search ............ 317/235.4; 357/52, 38, 357/39, 56

[56] References Cited
UNITED STATES PATENTS

| | | | |
|---|---|---|---|
| 3,099,591 | 7/1963 | Shockley | 317/235 |
| 3,146,135 | 8/1964 | Salt | 357/38 |
| 3,160,828 | 12/1964 | Strull | 357/38 |
| 3,197,681 | 7/1965 | Broussard | 357/38 |
| 3,391,287 | 7/1968 | Kao et al. | 317/235 |
| 3,408,545 | 10/1968 | De Cecco et al. | 317/235 |
| 3,437,889 | 4/1969 | Eugster | 357/39 |
| 3,437,889 | 4/1969 | Eugster | 317/235 |
| 3,445,301 | 5/1969 | Topas et al. | 317/235 |
| 3,555,372 | 1/1971 | Hutson | 357/39 |
| 3,556,878 | 1/1971 | Ginsbach et al. | 317/235 |
| 3,573,115 | 3/1971 | Topas | 317/235 |
| 3,588,632 | 6/1971 | Nakata et al. | 357/38 |
| 3,596,348 | 8/1971 | Stacey et al. | 317/235 |
| 3,608,186 | 9/1971 | Hutson | 317/235 |

FOREIGN PATENTS OR APPLICATIONS

| | | |
|---|---|---|
| 1,295,093 | 5/1969 | Germany |
| 2,021,843 | 5/1970 | Germany |
| 1,073,560 | 6/1967 | United Kingdom ........... 357/52 |
| 1,188,688 | 4/1970 | United Kingdom ........... 357/38 |
| 1,194,427 | 6/1970 | United Kingdom ........... 357/39 |
| 1,234,294 | 6/1971 | United Kingdom ........... 357/39 |
| 1,246,022 | 9/1971 | United Kingdom ........... 357/56 |
| 1,303,337 | 1/1973 | United Kingdom ........... 357/39 |

Primary Examiner—Andrew J. James
Assistant Examiner—Joseph E. Clawson, Jr.
Attorney, Agent, or Firm—Cushman, Darby & Cushman

[57] ABSTRACT

An improved method of manufacturing a mesa type thyristor includes the formation, onto at least one face of a semiconductor substrate of a prescribed conductivity type of a ring or rings, of a deeply diffused region of the same conductivity type or that of the substrate but of a higher impurity concentration. As a result, the ring or rings of the deeply diffused region, surrounding the essential part of the thyristor, are, subsequent to the process of mesa-etching, exposed along the peripheral surface linking both faces of the substrate. The high-doped ring serves to effectively prevent an undesirable inducing of an inversion layer (i.e. channel region) across both surfaces of the substrate.

1 Claim, 8 Drawing Figures

MESA TYPE THYRISTOR AND ITS MAKING METHOD

BACKGROUND OF THE INVENTION

The present invention relates to an improvement in the method of making a mesa type thyristor and the constitution of the thyristor made by the method.

Hitherto, there have been known mesa type thyristors, having a mesa surface along the periphery of a semiconductor substrate for attaining a high reverse breakdown voltage. However, such a mesa portion is likely to inudce an inversion layer (i.e. channel region) when sodium ions are adsorbed thereon.

In thyristors, wherein P-N junctions are formed near respective surfaces, an inversion layer allows a leakage current to flow therethrough across the P-N junctions and makes it difficult to attain the intended high reverse breakdown voltage. Such a shortcoming due to the inversion layer is liable to occur when a semiconductor substrate of very high specific resistivity is employed for making a thyristor with a high reverse breakdown voltage.

SUMMARY OF THE INVENTION

It is an object of this invention to provide a novel improvement in the method of making mesa type thyristor and the constitution of the thyristors made by the method, the thyristor having, around the periphery of the semiconductor substrate, a ring or rings of high-doped region for preventing formation of inverse layer.

BRIEF EXPLANATION OF THE DRAWING

FIG. 1b is a sectional sideview of the substrate at the sectional plane shown by 1b—1b in FIG. 1a;

DETAILED DESCRIPTION

Figure 1A:
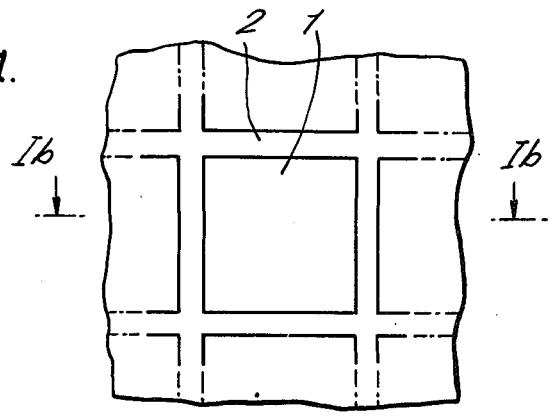
FIG. 1a is a plan view of a substrate semiconductor material from which a thyristor is formed.
Figure 1B:
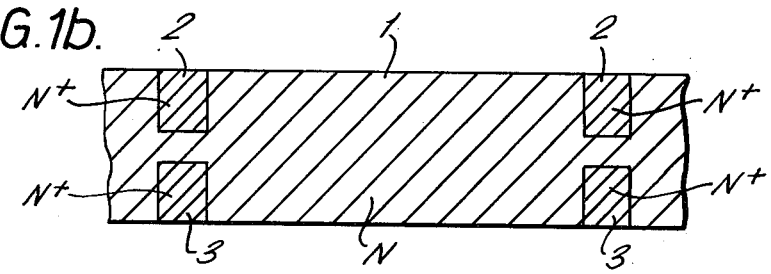

In FIG. 1a and FIG. 1b, 1 designates a semiconductor substrate, for instance, a silicon substrate, which has a prescribed conductivity, for instance N-type, by low doping of phosphorus at a concentration of about $10^{14}$–$10^{16}$ atoms/cc, to provide a specific resistivity of 5–100 cm. Then, rings of deeply diffused regions 2, 3 of impurities having the same conductivity type as that of the substrate but of a higher impurity concentration (about $10^{20}$ to $10^{21}$ atoms/cc) are formed on both surfaces of the substrate 1. The regions are made by selectively densely diffusing phosphorus as the impurity so as to form highdoped N$^+$ rings. These diffused region rings 2 and 3 are about 50 microns deep and 200 microns wide. The rings are formed so as to encircle the essential part of the thyristor therein, and may extend to at least one surface of the substrate 1. In actual mass production, the rings are square-shaped and are linked lengthwise as well as breadthwise in a checker-like pattern as shown by the chain lines in FIG. 1a.

Figure 2:
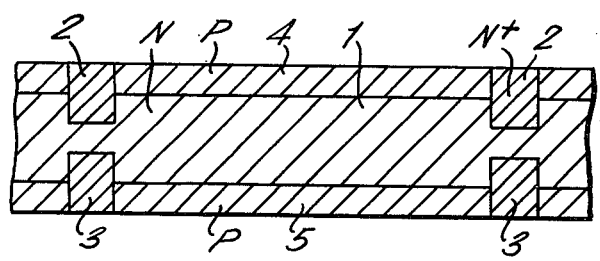
FIG. 2 to FIG. 7 are sectional sideviews of the substrate showing steps of making the thyristor.

Then, as shown in FIG. 2, into both opposing surfaces of the substrate 1, shallow diffused layers 4 and 5 having P-conductivity-type, that is, opposite to that of the substrate 1, are formed by diffusing an impurity, such as boron, therein, to a thickness of about $40\mu$ and having an impurity concentration of $10^{17}$ to $10^{19}$ atoms/cc. However, instead of diffusing layers 4 and 5, they may be epitaxially grown on substrate 1, with rings 2 and 3 subsequently diffused therein.

Figure 3:
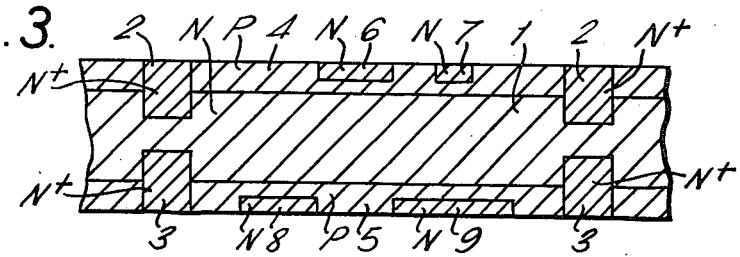

Then, as shown in FIG. 3, in the P-type regions 4, 5 encircled by the highly doped rings 2 and 3, N-type diffused regions 6, 7 and 8, 9, respectively, are formed by selectively diffusing phosphorus, to a depth of about 20 microns, into the regions 4 and 5. The impurity concentraton of regions 6, 7, 8 and 9 is about $10^{20}$–$10^{21}$ atoms/cc. Thus, the diffusing process into the substrate is completed.

Of course, in the above description, conventional diffusion masking techniques are typically used for the selective diffusions.

Figure 4:
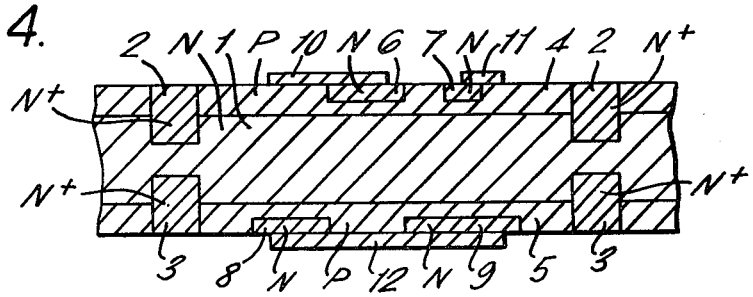

Then, by means of electroless nickel plating, a first anode electrode 10, a gate electrode 11 and a second anode electrode 12 are formed, respectively, as shown in FIG. 4.

Figure 5:
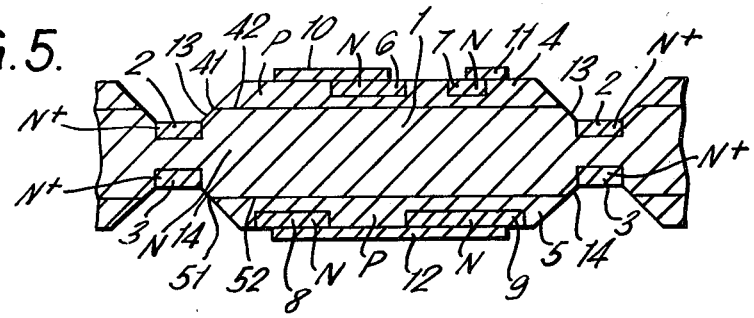

Then, by a known mesa-etching process utilizing known photoresist masks, parts of the highly doped rings 2 and 3 are mesa-etched, as shown in FIG. 5. so as to form mesa grooves 13 and 14, exposing therein the peripheral edge lines 41 and 51 of the P-N junctions 42 and 52, formed between the substrate 1 and the diffused region 4 and between the substrate 1 and diffused region 5, respectively. It is important that the depth of the mesa-etched grooves 13 and 14 should be controlled so as not to exceed the diffusion front, i.e., the innermost fronts of the ring regions 2 and 3, respectively, so that the ring or rings of the high-doped channel-cutting regions 2, 3 remain under the bottom of each of the mesa-etched grooves 13, 14 in the substrate 1. The width of the grooves 13, 14 at the surface of the substrate is about 500 microns.

Then, insulation layers 15 and 16 of, for instance, a silicon dioxide film, are selectively formed to cover the mesa-etched grooves 13 and 14, respectively, by a known process of forming a silicon dioxide passivation layer.

Figure 6:
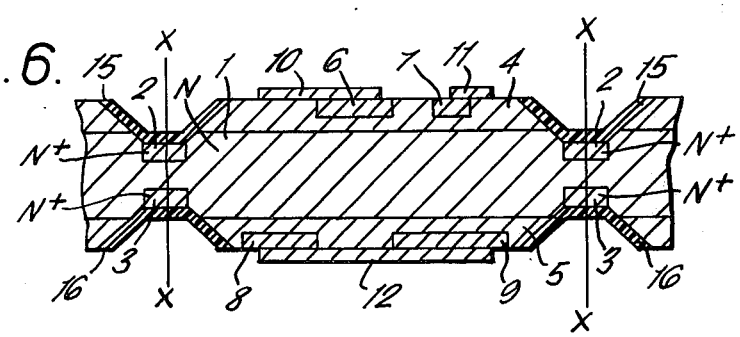
Figure 7:

Finally, the substrate is "marked" at the center lines of the mesa-etched grooves 13 and 14 by a known method, for instance, by scribing with a diamond scriber or with a laser scriber (i.e., engraving a fine groove by means of very fine intense pencil beam from a laser device). Then the substrate is cut, at the cutting planes X—X, X—X shown in FIG. 6, into sections of respective individual thyristor elements, as shown in FIG. 7. Each thyristor chip is about 4.2 mm by 4.2 mm square and 180–200 $\mu$ thick.

As is also shown in FIG. 7, the thyristor thus formed has two rings 2, 3 of N$^+$ highly-doped regions at the peripheral surface 17 around the substrate 1.

Advantageous features of this thyristor are as follows.

Even if sodium ions or other substances are adsorbed on the peripheral surface 17 where the substrate body is exposed, an undesirable inversion layer is not induced in the highly-doped regions 2 and 3. Therefore, undesirable linking by the inversion layer across the P-N junctions 42 and 52 is effectively prevented by the high-doped rings 2, 3, resulting in the elimination of leakage current between the P-N junctions 42 and 52. Thus, high reverse-breakdown voltage performance is attainable. This reverse-breakdown voltage may be on the order of 700–800 volts, and can reach 3,000 volts for a high resistivity substrate having a resistivity as high as 100 $\Omega$ cm or more.

Moreover, by means of the insulation layers 15 and 16, the exposed edges 41 and 51 of the P-N junctions 42 and 52, respectively, are sufficiently protected from possible pollution, assuring stable performance.

Though the foregoing embodiment shows a thyristor having two parallel high-doped rings at its peripheral surface, it is possible to obtain a considerable performance even with a single ring. Such a single ring may or may not penetrate the silicon substrate.

The important condition of the highly-doped ring is that the ring is provided at the exposed peripheral surface of the substrate, and that the conductivity of the ring is of the same type with that of the substrate but the impurity concentration of the ring is far higher than that of the substrate.

Application of this invention is not limited to bidirectional thyristors (i.e., silicon symmetrical switch) as illustrated, but is also applicable to other thyristors such as a triode A.C. switch, a gate-turn-off switch, a silicon controlled switch, a light-activated switch, etc.

While we have shown and described a mesa transistor in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What we claim is:

1. A mesa-type thyristor comprising:

a silicon substrate of a first conductivity type having upper and lower principal surfaces respectively on opposite sides of said substrate and a peripheral surface surroundingly extending between said principal surfaces, said substrate further having a pair of spaced mesa-etched surfaces on said peripheral surface encircling said substrate, mesa-etched said mesa-etched surfaces having outer peripheral edges respectively at said principal surfaces and extending respectively from said principal surfaces generally toward each other to a predetermined extent to define respective inner peripheral edges spaced apart a given distance, a pair of first regions of a second conductivity type, opposite said first conductivity type, respectively on said upper and lower principal surfaces for forming PN junctions therewith, a plurality of additional regions of said first conductivity type formed in said first regions, electrodes disposed in contact with at least said additional regions, and a pair of spaced electrodeless semiconductor ring regions of said first conductivity type and having an impurity concentration higher than that of said substrate, said ring regions being only in contact with and formed around said substrate in said peripheral surface and heightwise respectively extending from the said inner peripheral edges of said mesa-etched surfaces toward each other a distance substantially less than said given distance so as to expose between said rings a portion of said substrate which isolates said rings by providing high resistance relative to said rings and hence high breakdown voltage along said peripheral surface and for preventing PN junction leakage current by said ring regions effectively preventing the linking of an inversion layer across said PN junctions.

* * * * *